(12) United States Patent
Herr et al.

(10) Patent No.: US 11,770,113 B2
(45) Date of Patent: Sep. 26, 2023

(54) RESONANT LC POWER NETWORK FOR SUPERCONDUCTING DIGITAL CIRCUITS

(71) Applicant: IMEC USA NANOELECTRONICS DESIGN CENTER, Inc., Kissimmee, FL (US)

(72) Inventors: Quentin Paul Herr, Leuven (BE); Anna Yurievna Herr, Leuven (BE)

(73) Assignee: IMEC USA NANOELECTRONICS DESIGN CENTER, Inc., Kissimmee, FL (US)

(*) Notice: Subject to any disclaimer, the term of this patent is extended or adjusted under 35 U.S.C. 154(b) by 104 days.

(21) Appl. No.: 17/561,088

(22) Filed: Dec. 23, 2021

(65) Prior Publication Data

US 2023/0208400 A1  Jun. 29, 2023

(51) Int. Cl.
| | |
|---|---|
| *H03K 17/92* | (2006.01) |
| *H03H 11/02* | (2006.01) |
| *H01L 49/02* | (2006.01) |
| *H10N 60/12* | (2023.01) |
| *H10N 60/80* | (2023.01) |
| *H10N 60/01* | (2023.01) |
| *H10N 69/00* | (2023.01) |

(52) U.S. Cl.
CPC ............. *H03H 11/02* (2013.01); *H01L 28/10* (2013.01); *H01L 28/60* (2013.01); *H03K 17/92* (2013.01); *H10N 60/0912* (2023.02); *H10N 60/12* (2023.02); *H10N 60/805* (2023.02); *H10N 69/00* (2023.02)

(58) Field of Classification Search
CPC ...................................................... H03K 17/92
USPC .......................................................... 327/528
See application file for complete search history.

(56) References Cited

U.S. PATENT DOCUMENTS

| | | |
|---|---|---|
| 9,292,642 B2 | 3/2016 | Herr et al. |
| 9,466,643 B2 | 10/2016 | Herr et al. |
| 9,722,589 B1 | 8/2017 | Talanov et al. |

(Continued)

OTHER PUBLICATIONS

Herr, Quentin P., Anna Y. Herr, Oliver T. Oberg, and Alexander G. Ioannidis "Ultra-low-power superconductor logic." Journal of applied physics 109, No. 10 (2011): 103903.

(Continued)

*Primary Examiner* — Tomi Skibinski
(74) *Attorney, Agent, or Firm* — McDonnell Boehnen Hulbert & Berghoff LLP

(57) ABSTRACT

A superconducting circuit comprises a resonator and a Josephson junction. The resonator comprises an inductor and a capacitor. The inductor comprises a first terminal and a second terminal. The second terminal of the inductor is electrically coupled to a first terminal of the capacitor. A second terminal of the capacitor is electrically coupled to a first terminal of the Josephson junction. The terminal shared by the inductor and the capacitor is configured to be electrically coupled to an alternating current (AC) voltage source having a particular frequency and particular phase. The inductance of the inductor and the capacitance of the capacitor are selected to cause the resonator to resonate at a frequency and a phase that substantially match the particular frequency and the particular phase, respectively, of the AC voltage source to facilitate switching a state of the Josephson junction via a single flux quantum (SFQ) pulse.

20 Claims, 8 Drawing Sheets

(56) References Cited

U.S. PATENT DOCUMENTS

| | | | |
|---|---|---|---|
| 10,133,299 B1 | 11/2018 | Strong et al. | |
| 10,431,867 B1 | 10/2019 | Strong et al. | |
| 10,474,183 B2 | 11/2019 | Strong et al. | |
| 10,520,974 B2* | 12/2019 | Strong | G06F 1/10 |
| 10,608,044 B1 | 3/2020 | Herr et al. | |
| 10,754,371 B1 | 8/2020 | Strong et al. | |
| 10,884,450 B2 | 1/2021 | Strong et al. | |
| 2020/0287118 A1 | 9/2020 | Herr et al. | |

OTHER PUBLICATIONS

Herr, Anna Y., Quentin P. Herr, Oliver T. Oberg, Ofer Naaman, John X. Przybysz, Pavel Borodulin, and Steven B. Shauck. "An 8-bit carry look-ahead adder with 150 ps latency and sub-microwatt power dissipation at 10 GHz." Journal of Applied Physics 113, No. 3 (2013): 033911.

Hosoya, Mutsumi, Willy Hioe, Juan Casas, Ryotaro Kamikawai, Yutaka Harada, Yasou Wada, Hideaki Nakane, Reiji Suda, and Eiichi Goto. "Quantum flux parametron: a single quantum flux device for Josephson supercomputer." IEEE Transactions on Applied Superconductivity 1, No. 2 (1991): 77-89.

Talanov, Vladimir V., Derek Knee, David Harms, Kieran Perkins, Andrew Urbanas, Jonathan Egan, Quentin Herr, and Anna Herr. "Propagation of Picosecond Pulses on Superconducting Transmission Line Interconnects." arXiv preprint arXiv:2104.07371 (2021).

Tolpygo, Sergey K., Vladimir Bolkhovsky, Ravi Rastogi, Scott Zarr, Evan Golden, Terence J. Weir, Leonard M. Johnson, Vasili K. Semenov, and Mark A. Gouker. "A 150-nm node of an eight-Nb-layer fully planarized process for superconductor electronics." In Proc. ASC2020 Conf. 2020.

Tolpygo, Sergey K., and Denis Amparo. "Fabrication-process-induced variations of Nb/Al/AlOx/Nb Josephson junctions in superconductor integrated circuits." Superconductor Science and Technology 23, No. 3 (2010): 034024.

Tolpygo, Sergey K., and Vasili K. Semenov. "Increasing integration scale of superconductor electronics beyond one million Josephson junctions." In Journal of Physics: Conference Series, vol. 1559, No. 1, p. 012002. IOP Publishing, 2020.

Henry, M. David, S. W. Smith, R. M. Lewis, and J. F. Ihlefeld. "Stabilization of ferroelectric phase of Hf0. 58Zr0. 42O2 on NbN at 4 K." Applied Physics Letters 114, No. 9 (2019): 092903.

Olaya, David, Paul D. Dresselhaus, Samuel P. Benz, Jon Bjarnason, and Erich N. Grossman. "Amorphous Nb—Si barrier junctions for voltage standard and digital applications." IEEE transactions on applied superconductivity 19, No. 3 (2009): 144-148.

Aldrigo, M., M. Dragoman, E. Laudadio, S. Iordanescu, M. Modreanu, I. M. Povey, F. Nastase et al. "Microwave applications of zirconium-doped hafnium oxide ferroelectrics: From nanoscale calculations up to experimental results." In 2020 IEEE/MTT-S International Microwave Symposium (IMS), pp. 520-523. IEEE, 2020.

Holmes, D. Scott, Andrew L. Ripple, and Marc A. Manheimer. "Energy-efficient superconducting computing—Power budgets and requirements." IEEE Transactions on Applied Superconductivity 23, No. 3 (2013): 1701610-1701610.

Kroger, H., L. Smith, D. Jillie, J. Thaxter, R. Aucoin, L. Currier, C. Potter, D. Shaw, and P. Willis. "Hydrogenated amorphous silicon barriers for niobium-niobium Josephson junctions." IEEE Transactions on Magnetics 21, No. 2 (1985): 870-873.

"Cryogenic Electronics and Quantum Information Processing", International Roadmap for Devices and Systems, IEEE 2020, 83 pages.

* cited by examiner

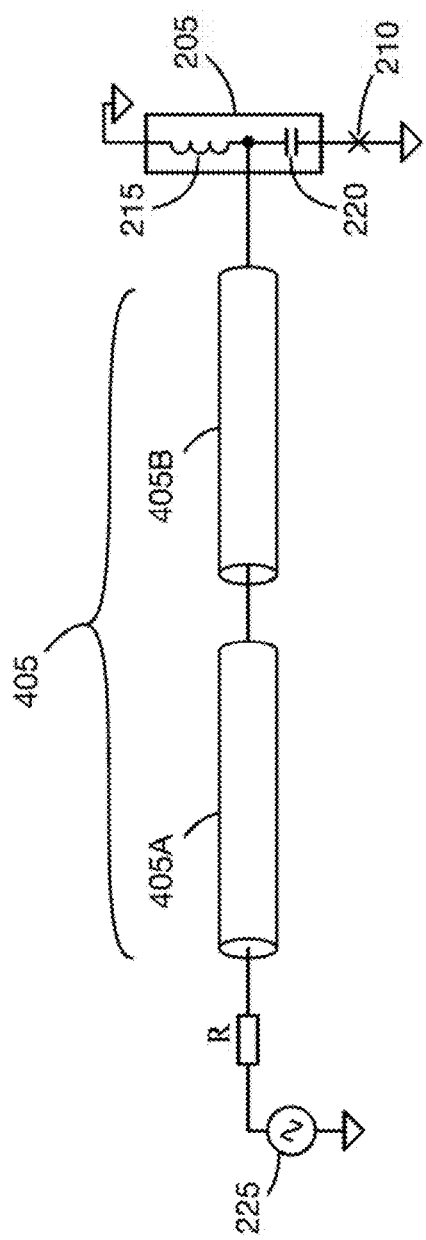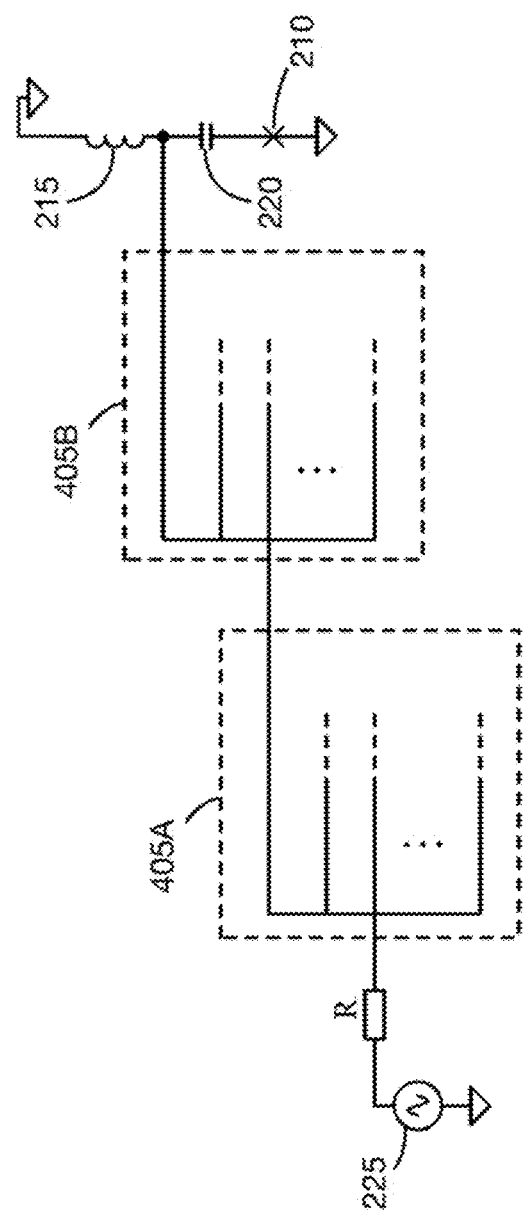
FIG. 4A
FIG. 4B

600

605 — FORMING, IN FIRST LAYERS OF A FABRICATION STACK, A RESONATOR, WHEREIN THE RESONATOR COMPRISES:
  AN INDUCTOR COMPRISING A FIRST TERMINAL AND A SECOND TERMINAL; AND
  A CAPACITOR COMPRISING A FIRST TERMINAL ELECTRICALLY COUPLED TO THE SECOND TERMINAL OF THE INDUCTOR

610 — FORMING, IN SECOND LAYERS OF THE FABRICATION STACK, A JOSEPHSON JUNCTION DEVICE, WHEREIN THE JOSEPHSON JUNCTION COMPRISES A FIRST TERMINAL ELECTRICALLY COUPLED TO A SECOND TERMINAL OF THE CAPACITOR AND A SECOND TERMINAL ELECTRICALLY COUPLED TO THE COMMON NODE,
  WHEREIN THE TERMINAL SHARED BY THE INDUCTOR AND THE CAPACITOR IS CONFIGURED TO BE ELECTRICALLY COUPLED TO AN ALTERNATING CURRENT (AC) VOLTAGE SOURCE HAVING A PARTICULAR FREQUENCY AND PARTICULAR PHASE,
  WHEREIN AN INDUCTANCE OF THE INDUCTOR AND A CAPACITANCE OF THE CAPACITOR ARE SELECTED TO CAUSE THE RESONATOR TO RESONATE AT A FREQUENCY AND A PHASE THAT SUBSTANTIALLY MATCH THE PARTICULAR FREQUENCY AND THE PARTICULAR PHASE, RESPECTIVELY, OF THE AC VOLTAGE SOURCE TO FACILITATE SWITCHING A STATE OF THE JOSEPHSON JUNCTION VIA A SINGLE FLUX QUANTUM (SFQ) PULSE

Fig. 6

RESONANT LC POWER NETWORK FOR SUPERCONDUCTING DIGITAL CIRCUITS

FIELD OF THE DISCLOSURE

This application relates to superconducting circuits. In particular, this application discloses a resonant LC power network for superconducting digital circuits.

BACKGROUND

Superconducting digital systems are capable of performing computing operations at clock speeds in excess of 100 GHz. In these systems, the circuits comprise superconducting wires and Josephson junctions that together form superconducting loops in which information in the form of a single flux magnetic quantum (SFQ) is encoded and stored.

The superconducting circuits can be configured to implement traditional logic gates such as AND gates, OR gates, Flip Flops, etc. These gates, in turn, can be configured to implement more complex logic such as shift registers, counters, processors, etc.

Manufacturing superconducting digital systems at scale is difficult due to fabrication limitations related to power distribution, logic efficiency, and memory density.

SUMMARY

In a first aspect, a superconducting circuit comprises a resonator and a Josephson junction. The resonator comprises an inductor comprising a first terminal and a second terminal, and a capacitor comprising a first terminal electrically coupled to the second terminal of the inductor. The Josephson junction comprises a first terminal electrically coupled to a second terminal of the capacitor and a second terminal electrically coupled to the common node. The terminal shared by the inductor and the capacitor is configured to be electrically coupled to an alternating current (AC) voltage source having a particular frequency and particular phase. The inductance of the inductor and the capacitance of the capacitor are selected to cause the resonator to resonate at a frequency and a phase that substantially match the particular frequency and the particular phase, respectively, of the AC voltage source to facilitate switching a state of the Josephson junction via a single flux quantum (SFQ) pulse.

In a second aspect, a method for fabricating a superconducting circuit comprises forming, in first layers of a fabrication stack, a resonator, and forming, in second layers of the fabrication stack, a Josephson junction device. The resonator comprises an inductor comprising a first terminal and a second terminal, and a capacitor comprising a first terminal electrically coupled to the second terminal of the inductor. The Josephson junction comprises a first terminal electrically coupled to a second terminal of the capacitor and a second terminal electrically coupled to the common node. The terminal shared by the inductor and the capacitor is configured to be electrically coupled to an alternating current (AC) voltage source having a particular frequency and particular phase. An inductance of the inductor and a capacitance of the capacitor are selected to cause the resonator to resonate at a frequency and a phase that substantially match the particular frequency and the particular phase, respectively, of the AC voltage source to facilitate switching a state of the Josephson junction via a single flux quantum (SFQ) pulse.

In a third aspect, a device comprises a superconducting circuit. The superconducting circuit comprises a resonator and a Josephson junction. The resonator comprises an inductor comprising a first terminal and a second terminal and a capacitor comprising a first terminal electrically coupled to the second terminal of the inductor. The Josephson junction comprises a first terminal electrically coupled to a second terminal of the capacitor and a second terminal electrically coupled to the common node. The terminal shared by the inductor and the the capacitor is configured to be electrically coupled to an alternating current (AC) voltage source having a particular frequency and particular phase. The inductance of the inductor and the capacitance of the capacitor are selected to cause the resonator to resonate at a frequency and a phase that substantially match the particular frequency and the particular phase, respectively, of the AC voltage source to facilitate switching a state of the Josephson junction via a single flux quantum (SFQ) pulse.

BRIEF DESCRIPTION OF THE FIGURES

The above, as well as additional features, will be better understood through the following illustrative and non-limiting detailed description of example embodiments, with reference to the appended drawings.

FIG. 4A illustrates a schematic of a two-stage feed network that facilitates driving the resonators of a plurality of LC tiles associated with a particular phase with a single AC voltage source, in accordance with example embodiments.

FIG. 4B illustrates a schematic of a two-stage feed network that facilitates driving the resonators of a plurality of LC tiles associated with a particular phase with a single AC voltage source, in accordance with example embodiments.

FIG. 6 illustrates operations that facilitate fabricating a superconducting circuit, in accordance with example embodiments.

Figure 1:
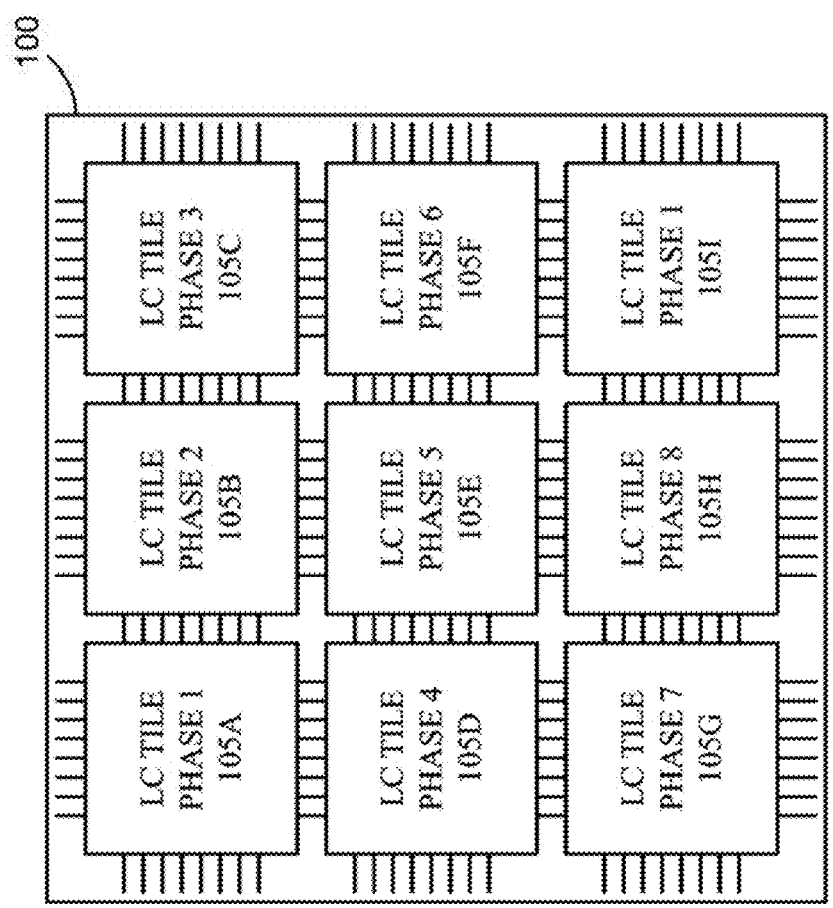
FIG. 1 illustrates a group of LC tiles arranged on a superconducting integrated circuit, in accordance with example embodiments.

All the figures are schematic, not necessarily to scale, and generally only show parts that are necessary to elucidate example embodiments, wherein other parts may be omitted or merely suggested.

DETAILED DESCRIPTION

Various examples of systems, devices, and/or methods are described herein with reference to the accompanying drawings. Any embodiment, implementation, and/or feature described herein as being an example is not necessarily to be construed as preferred or advantageous over any other embodiment, implementation, and/or feature unless stated as such. Thus, other embodiments, implementations, and/or features may be utilized, and other changes may be made without departing from the scope of the subject matter presented herein.

Accordingly, the examples described herein are not meant to be limiting. It will be readily understood that the aspects of the present disclosure, as generally described herein, and illustrated in the figures, can be arranged, substituted, combined, separated, and designed in a wide variety of different configurations.

Further, unless the context suggests otherwise, the features illustrated in each of the figures may be used in combination with one another. Thus, the figures should be generally viewed as component aspects of one or more overall embodiments, with the understanding that not all illustrated features are necessary for each embodiment.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

Moreover, terms such as "substantially" or "about" that may be used herein are meant that the recited characteristic, parameter, or value need not be achieved exactly, but that deviations or variations, including, for example, tolerances, measurement error, measurement accuracy limitations and other factors known to those skilled in the art, may occur in amounts that do not preclude the effect the characteristic was intended to provide.

Further, terms such as "A coupled to B," "A electrically coupled to B," etc., do not necessarily mean that items A and B are directly coupled to one another. For example, a first component electrically coupled to a second component is interpreted to mean that the components are either directly coupled (e.g., via a conductor) or coupled to one another via one or more resistors, capacitors, inductors, and/or other active or passive components.

As noted above, superconducting circuits comprise superconducting wires and Josephson junctions that together form superconducting loops in which information in the form of a single flux magnetic quantum (SFQ) is encoded and stored. Examples of AC powered Single Flux Quantum (AC-SFQ) superconducting circuits correspond to reciprocal quantum logic (RQL) circuits, and quantum flux parametron (QFP) circuits, where both power and clock are provided by multi-phase alternating current signals.

The Superconducting wires are formed from materials that can carry a direct electrical current (DC) in the absence of an electric field. Such materials have almost zero resistance at or below their critical temperature. One example superconductor, niobium, has a critical temperature (Tc) of 9.3 Kelvin. At temperatures below the critical temperature, niobium is superconductive. However, at temperatures above the critical temperature, niobium behaves like a normal metal with electrical resistance.

The Josephson junctions include two superconductors coupled via a region that impedes current. Examples of this region include or correspond to a physical narrowing of the superconductor itself, a metal region, or a thin insulating barrier. Some examples of Josephson junctions comprise niobium superconductors and an $Al_2O_3$ barrier therebetween. When the potential difference between the two superconductors is integrated with respect to time over one cycle of phase change, the magnetic flux through the loop changes by an integer multiple of a single quantum of magnetic flux. The voltage pulse associated with the single quantum of magnetic flux corresponds to the SFQ pulse referred to above. As an example, overdamped Josephson junctions can create individual SFQ pulses. In AC-SFQ circuits, each Josephson junction may be part of one or more superconducting loops. The phase difference across the junction may be modulated by the magnetic flux applied to the loop.

As noted, manufacturing these types of circuits at scale is difficult due to fabrication limitations related to clock and power distribution, logic efficiency, and memory density.

Some examples disclosed herein ameliorate some of these issues. For example, disclosed herein are several examples of superconducting circuits that improve clock distribution within a superconducting integrated circuit. The superconducting circuit comprises a resonator and a Josephson junction. The resonator comprises an inductor that comprises a first terminal and a second terminal, and a capacitor comprising a first terminal electrically coupled to the second terminal of the inductor.

The Josephson junction comprises a first terminal electrically coupled to a second terminal of the capacitor and a second terminal electrically coupled to the common node. The first terminal of the capacitor is configured to be electrically coupled to an alternating current (AC) voltage source having a particular frequency and particular phase. An inductance of the inductor and a capacitance of the capacitor are selected to cause the resonator to resonate at a frequency and a phase that substantially match the particular frequency and the particular phase, respectively, of the AC voltage source to facilitate switching a state of the Josephson junction via a single flux quantum (SFQ) pulse.

In some examples, these superconducting circuits are replicated across the integrated circuit. Different groups of these circuits are coupled to different phases of an AC clock and are configured to provide power and clocking to various AC-SFQ circuits arranged within the integrated circuit.

In some examples, superconducting resonators associated with the same phase are electrically coupled with one another via a mesh structure formed in the integrated circuit. This ensures that AC-SFQ circuits arranged in different areas of the integrated circuit remain equalized with one another.

Minimizing power loss in the resonators is an important consideration. In this regard, in some examples, interconnects between the various components of the resonators and other circuits comprise NbTiN, which exhibits low power loss. Some examples of inductors/coils described herein comprise NbTiN and have an internal quality factor $Q_i \approx 10^5$. Some examples of capacitors described herein correspond to metal-insulator-metal (MIM) capacitors that have NbTiN electrodes/terminals and a high-K dielectric facilitates tuning or adjusting the capacitance of the capacitor by adjusting a DC voltage applied across the terminals of the capacitor. In some examples, the high-K dielectric is HfOx(Si).

Losses in the resonators generally decrease with temperature and increase with frequency. Some examples of the resonators described herein are 85% efficient. This translates to 0.12 W of static power dissipation on a fully populated integrated circuit that comprises, for example, 400 million Josephson Junctions.

FIG. 1 illustrates a group of LC tiles 105 arranged on a superconducting integrated circuit 100. In an example, each LC tile 105 comprises a stacked configuration of superconducting circuits that implements a resonator. The resonator of each LC tile 105 is driven at a particular frequency and a particular phase and is configured to resonate at substantially the same frequency and phase at which it is being driven.

Some examples of the superconducting circuits of each LC tile 105 further comprise one or more AC-SFQ circuits, and these AC-SFQ circuits are powered and clocked by the corresponding resonators of the LC tiles 105. The physical placement of Josephson junctions of these circuits does not necessarily correspond to physical placement of any particular LC tile 105. In some examples, the Josephson junctions and corresponding capacitors are connected to one inductor from different locations to form LC tile 105 with predefined impedances. This aspect further facilitates connecting a Josephson junction to an inductor that determines its phase. In some examples, the phase allocation per Josephson junction can be done using automated algorithms concurrently with place and route of AC-SFQ circuits.

In an example, the frequency associated with the resonator of each LC tile 105 is the same (e.g., 100 GHz) and the phase of each resonator is different. The number of phases required generally relates to the size of the pipeline of AC-SFQ circuits being driven by the resonators, the frequency at which the AC-SFQ circuits are clocked, the size of the integrated circuit, etc. If eight phases are required, the phases of the resonators are spaced apart by 45°. For example, the phase of the resonator of a first LC tile 105A is 0°, the phase of the resonator of a second LC tile 105B is 45°, the phase of the resonator of a third LC tile 105C is 90°, etc. If four phases are required, the phases of the resonators are spaced apart by 90°. For example, the phase of the resonator of a first LC tile 105A is 0°, the phase of the resonator of a second tile 105B is 90°, the phase of the resonator of a third LC tile 105C is 180°, etc.

In the illustrated example, eight phases are used and the phase of the resonator of the ninth LC tile 105I matches the phase of the resonator of the first LC tile 105A. In this regard, some examples of the superconducting integrated circuit 100 comprise a plurality of LC tile groups. In some examples, the group or array of LC tiles illustrated in FIG. 1 is repeated across the superconducting integrated circuit 100, and LC tiles of the respective groups are associated with the first phase, the second phase, etc. Some examples of the superconducting integrated circuit comprise thousands or tens of thousands of LC tiles that are arranged within respective groups.

As described in further detail below, some examples of the superconducting integrated circuit 100 comprise one or more conductive interconnects that facilitate driving the resonators of the LC tiles 105 of a particular phase with a common AC voltage source of the particular phase. Some examples of the superconducting integrated circuit 100 further comprise one or more conductive interconnects that facilitate phase and amplitude equalization of resonators of the various groups that are associated with the same phase.

Figure 2A:
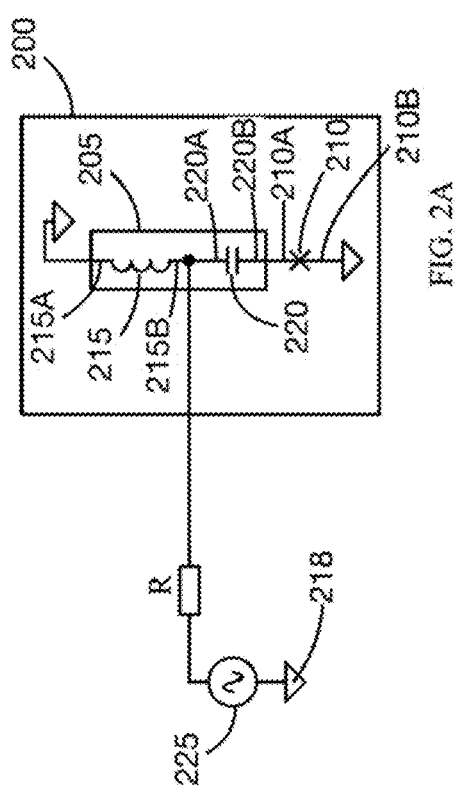
FIG. 2A illustrates a schematic of a superconducting circuit, in accordance with example embodiments.

FIG. 2A illustrates a schematic of an example of a superconducting circuit 200. An example of the superconducting circuit 200 corresponds to the superconducting circuit referred to above. The superconducting circuit 200 includes a resonator 205 and a Josephson junction 210.

An example of the resonator 205 comprises an inductor 215 and a capacitor 220. The inductor 215 comprises a first terminal (e.g., terminal 215A) and a second terminal (e.g., terminal 215B). In some examples, the first terminal is electrically coupled to a common node (e.g., common node 218) and the second terminal (e.g., terminal 215B) is electrically coupled to a first terminal (e.g., terminal 220A) of the capacitor 220. The capacitor 220 comprises a second terminal (e.g., terminal 220A) that is configured to be electrically coupled to a first terminal (e.g., terminal 210A) of a Josephson junction 210. A second terminal (e.g., terminal 210B) of the Josephson junction 210 is electrically coupled to the common node (e.g., also node 218).

The first terminal of the capacitor 220 is configured to be electrically coupled to an alternating current (AC) voltage source 225 via coupling resistor R. In some examples, the AC voltage source 225 and the coupling resistor are off-chip. The AC voltage source 225 outputs a signal having a particular magnitude, frequency, and phase. Upon being driven by the AC voltage source 225, the resonator generates an AC signal that applies a bias voltage to the Josephson junction 210.

In an example, the inductance of the inductor 215 and the capacitance of the capacitor 220 are selected to cause the resonator 205 to resonate at a frequency, and a phase that substantially match the particular frequency and the particular phase, respectively, of the AC voltage source 225 to facilitate biasing the Josephson junction 210 and, therefore, facilitate switching a state (e.g., advancing the superconductor phase) of the Josephson junction 210 via a SFQ pulse. For example, the inductance and the capacitance of the resonator 205 are selected to satisfy the expression:

$$f = \frac{1}{2\pi\sqrt{LC}}$$

where f is the resonant frequency, L is the inductance, and C is the capacitance.

The particular values selected for the output impedance and magnitude of the AC voltage source 225, the inductance of the inductor 215, etc., may be based and/or may depend on various parameters. For instance, for a frequency of 30 GHz, Josephson Junction bias current of 30 µA, loaded quality factor Q of 230, and capacitance of 4.5 fF, the inductance is determined to be 6.25 nH, the impedance of the resonator 205 is determined to be 1.18 kΩ, the coupling resistor, R, is determined to be 273 kΩ, and the magnitude of the AC signal is determined to be 45.2 mV.

Figure 2B:
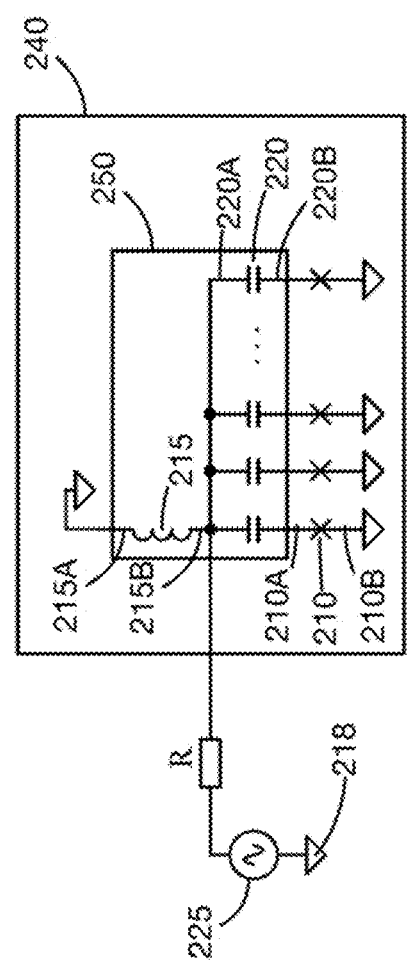
FIG. 2B illustrates a schematic of a superconducting circuit that comprises a resonator configured to bias a group of Josephson junctions, in accordance with example embodiments.

FIG. 2B illustrates a schematic of an example of a superconducting circuit 240 that comprises a resonator 250 configured to bias a group of Josephson junctions 210. In this example, a plurality of capacitors 220 are electrically coupled to the second terminal of the inductor 215 and each Josephson junction 110 is electrically coupled to one of the plurality of capacitors 220. The inductance of the inductor 215 scales inversely with the number of capacitors 220. In particular, the inductance of the inductor 215 and the capacitances of the plurality of capacitors 220 are selected to satisfy the expression:

$$f = \frac{1}{2\pi\sqrt{LNC}}$$

where f is the resonant frequency, L is the inductance, C is the capacitance of each of the plurality of capacitors 220, and N corresponds to the number of capacitors 220, which in some examples corresponds to the number of Josephson junctions 210.

According to this expression, the inductance of a combined 100 bias taps is 10,000 times smaller than that of 100 stand-alone bias taps (e.g., bias taps configured according to the resonator 205 of FIG. 2A). For instance, for the same frequency, bias current, quality factor Q, and capacitance requirements used in the example above, the inductance is determined to be 62.5 pH, the impedance of the resonator is determined to be 11.8Ω, the coupling resistor is determined to be 2.73 kΩ, and the magnitude of the AC signal is determined to be 45.2 mV. As noted below, fabrication of the inductor 215 of the resonator 250 of FIG. 2B takes up less space (e.g., two-dimensional area and/or three-dimensional volume) than the inductor 215 of the resonator 205 of FIG. 2A by virtue of the inductance being 10,000 times smaller.

Figure 2C:
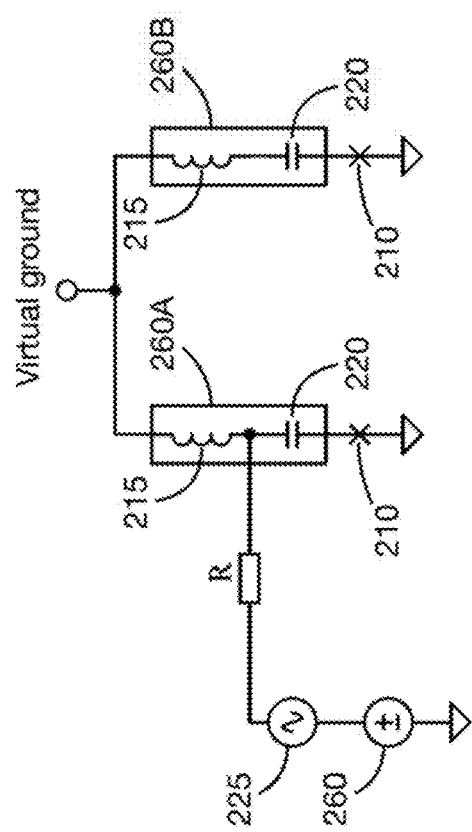
FIG. 2C illustrates a schematic of two resonators being driven by the same AC voltage source, in accordance with example embodiments.

FIG. 2C illustrates a schematic example of two resonators 260A, 260H being driven by the same AC voltage source 225. As noted above, in some examples, the number of AC voltage sources 225 matches the number of different phases (e.g., one AC voltage source for every 45° interval of a 360° cycle). In the example of FIG. 2C, the resonators 260A, 260B are configured to resonate at AC signals that are 180° out-of-phase with one another when driven by the same AC voltage source 225. This, in turn, facilitates dividing by two the number of AC voltage sources 225 required for providing any particular number of phases. For example, four AC voltage sources 225 can be used to generate eight phases. The resonators 260A, 260B in the figure generally correspond to the resonator 205 of FIG. 2A. However, the aspects discussed herein apply equally to the resonator 250 of FIG. 2B.

As shown, first terminals of the inductors 215 of the resonators 260A, 260B are electrically coupled to one another. The node at which the two inductors 215 are coupled corresponds to a virtual ground node in the sense that the AC voltage will be small at this node. In this configuration, the first resonator 260A resonates at a phase that substantially matches the phase of the AC voltage source 225. The second resonator 260B resonates at the same frequency, but 180° out-of-phase with first resonator 260A.

Also shown in FIG. 2C, in some examples, a DC voltage source 260 is inserted in series with the AC voltage source 225 and facilitates tuning the resonators 260A, 260B. In this regard, and as described in more detail below, some examples of the capacitors 220 comprise a dielectric material such as $HfO_x(Si)$ that facilitates controlling the capacitance of the capacitors 220 via a DC voltage. In the configuration of FIG. 2C, the same DC voltage generated by the DC voltage source 260 will be present on the respective capacitors 220 of the first resonator 260A and the second resonator 260B, ensuring that the corresponding capacitances of the capacitors 220 match. In an example, a DC voltage across the capacitors 220 in a range 1-5 V facilitates tunability in the range of ±10%.

Figure 3A:
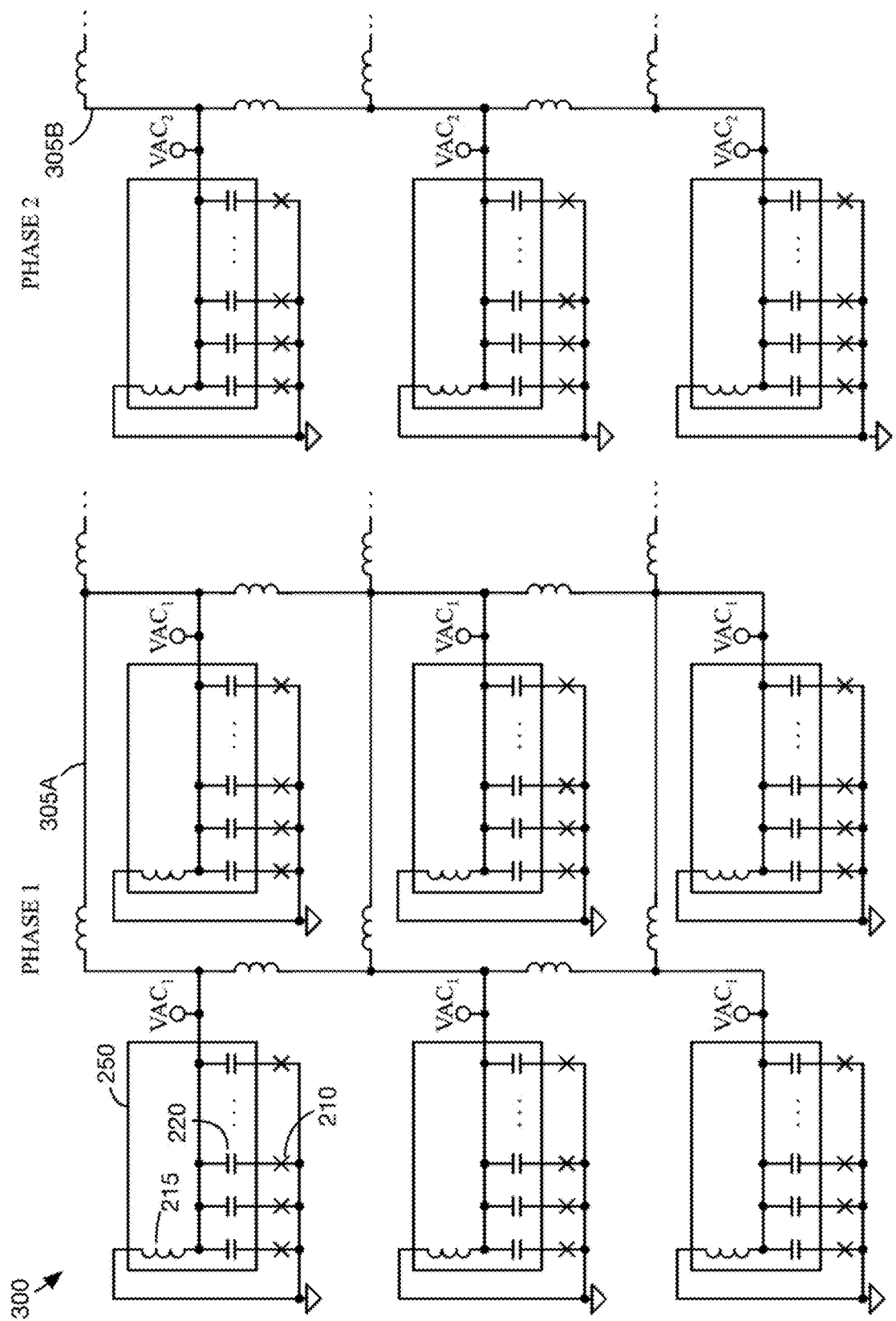
FIG. 3A illustrates a schematic of interconnected resonators, in accordance with example embodiments.

FIG. 3A illustrates a schematic 300 of an example of interconnected resonators 250. Shown are several groups of resonators 250 and a conductive interconnect 305 that comprises short/inductive segments that couple the resonators 250 of the groups to one another.

The resonators 250 generally correspond to the resonator 250 illustrated in FIG. 2B. However, the aspects discussed herein apply equally to the resonator 205 of FIG. 2A. The resonators 250 are arranged in groups, and each group of resonators 250 is coupled to an AC voltage source 225 of a particular phase. The number of groups generally corresponds to the number of phases. For example, a first subset of resonators 250 (e.g., PHASE 1 resonators) is configured to be electrically coupled to a first AC voltage source 225 having a first phase (e.g., $VAC_1$). A second subset of the resonators 250 (e.g., PHASE 2 resonators) is configured to be coupled to a second AC voltage source 225 having a second phase (e.g., $VAC_2$) that is different from the first phase, etc. Where there are eight phases, there are, in an example, eight groups of resonators 250.

The conductive interconnect 305 is configured to facilitate equalizing respective phases and amplitudes of resonators 250 belonging to the same group. Segments of the conductive interconnect 305 that are between the resonators 250 are illustrated as inductive elements. The lengths of the segments between resonators 250 for a particular phase are electrically short so that the propagation time of the signal between the resonators of a particular group is very small compared to the period of the resonance.

In some examples, the conductive interconnect 305 comprises a number of conductive interconnect sections that corresponds to the number of phases. For instance, a first conductive interconnect section 305A is configured to couple resonant energy between the first subset of the plurality of resonators 250 (e.g., PHASE 1 resonators) to facilitate equalizing respective phases and amplitudes of the first subset of resonators 250 with one another. A second conductive interconnect section 305B is configured to couple resonant energy between the second subset of resonators 250 to facilitate equalizing respective phases and amplitudes of the second subset of resonators 250 with one another, etc.

Figure 3B:
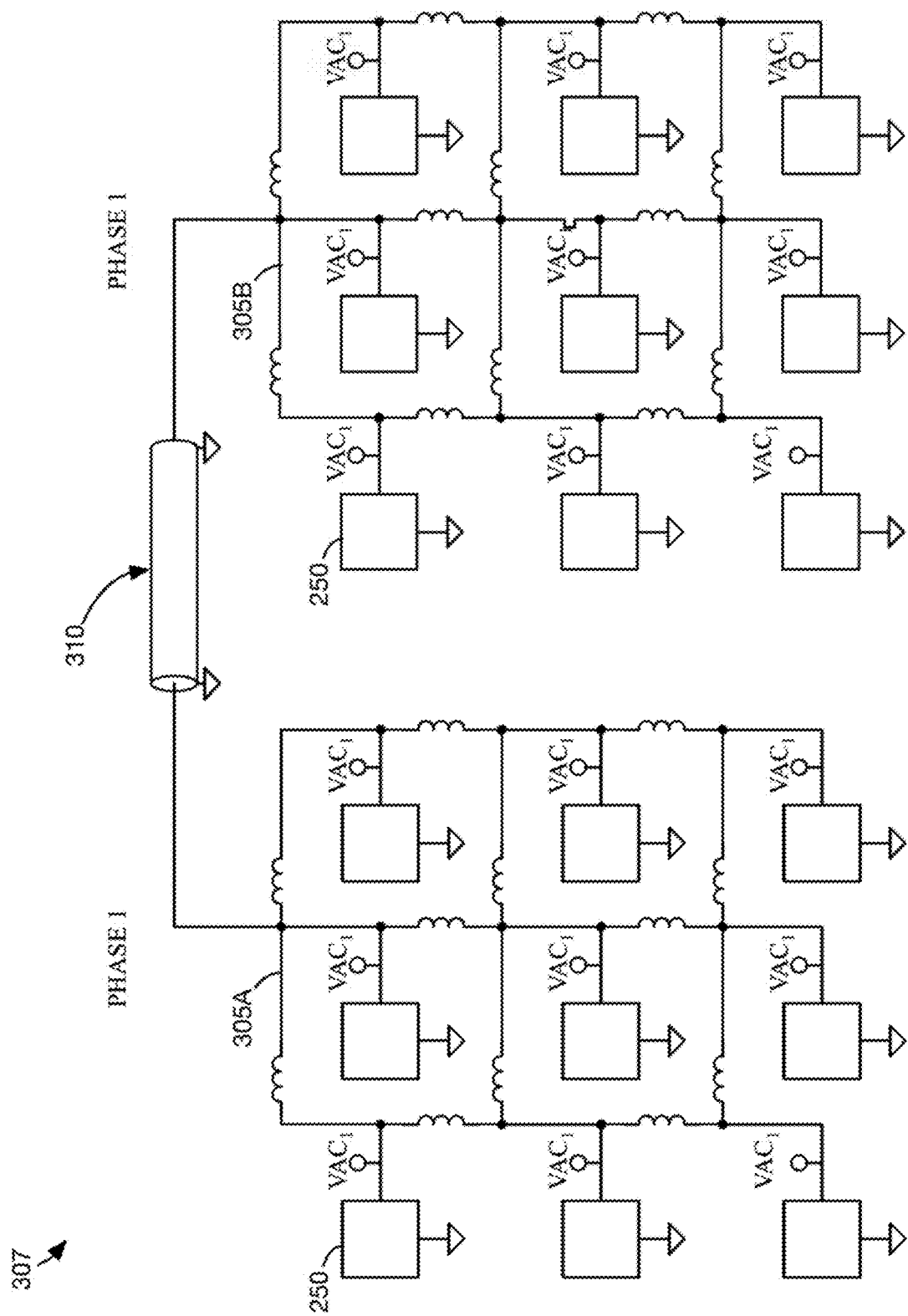
FIG. 3B illustrates a schematic of interconnected resonators, in accordance with example embodiments.

FIG. 3B is another example of a schematic 307 of interconnected resonators 250. Shown are several groups of resonators 250 the details of which are omitted for brevity, a conductive interconnect 305 that comprises short/inductive segments that couple the resonators 250 of the groups to one another, and a transmission line 310 that facilitates equalizing respective phases and amplitudes of groups of resonators that are electrically far from one another when compared to the period of the resonance. In this regard, the electrical length of the transmission line 310 is related to the phase difference between the resonators 250. In some examples, groups of resonators associated with a particular/same phase that are electrically far from one another are coupled with a full-wave transmission line. In some examples, groups of resonators associated with phases that differ by, for example, 180 degrees (e.g., group 1 phase is 0 degrees and group 2 phase is 180 degrees) are coupled by a half-wave transmission line 310 or a 3/2-wave line.

It should be noted that some examples of conductive interconnects 305 described above can comprise other components such as capacitors, resistors, mutual inductors, etc. Further any particular implementation of the integrated circuit can include numerous transmission lines and conductive interconnect sections that facilitate equalizing phases and amplitudes of various resonators arranged across the integrated circuit.

As described further below, in some examples, the conductors are implemented in one or more layers of a fabrication stack. In some examples, the conductors are configured to form a 2-dimensional mesh or interconnect. Such a configuration provides good frequency separation of the desired, lowest resonance frequency mode from parasitic modes, which is a central aspect of a practical design. For example, a first group of conductors is implemented on a first layer of the fabrication stack, and the conductors on this layer extend in a first direction (e.g., X direction). A second group of conductors is implemented on a second layer of the fabrication stack, and these conductors extend in a second direction that may be orthogonal to the first direction (e.g., Y direction). In some examples, a conductor associated with a particular phase includes a first portion that is implemented on the first layer and a second portion that is implemented on the second layer. In some examples, one or more vias are implemented between the first and the second layers to couple the first and second conductor portions together. In some examples, the conductors associated with opposite phases are interleaved with one another.

FIG. 4A illustrates a schematic of an example of a two-stage feed network 405 or splitter that facilitates driving the resonators 205 of a plurality of LC tiles 105 associated with a particular phase with a single AC voltage source 225.

As noted above, some examples of a superconducting integrated circuit comprise millions of LC tiles 105 and these LC tiles 105 comprise resonators 205 that are associated with one of several phases (e.g., eight phases). At scale, the parallel combination of, for example, 50M resonators 205 of a given phase has a relatively small impedance of about 50 µΩ. On the other hand, a typical output impedance of an AC voltage source is about 50Ω. A feed network is, therefore, necessary to transform the impedance of the AC voltage source 225 to an impedance that matches the impedance of the resonators 205. In an example, a multistage quarter-wave-segment design can be used to produce a small, loaded quality factor of a few hundred, which is small enough and which provides high stability for the power in the resonator independent of Josephson junction switching statistics.

As shown in FIG. 4B, the first stage 405A of the two-stage feed network 405 is configured to branch the AC voltage source 225 to a first number of filaments, and the second stage 405B of the two-stage feed network 405 is configured to further branch these filaments. Each of these filaments is electrically coupled to the resonator of a particular LC tile of a particular phase. In an example, the first stage 405A of the two-stage feed network 405 is configured to branch the AC voltage source 225 to 256 filaments, each having an impedance of 100 ohms. The second stage 405A of the two-stage network 405 is configured to branch the 256 filaments of the first stage to 33000 filaments, each having an impedance of 100 ohms. This configuration produces a loaded Q of 230. Lower values of loaded Q can be obtained with a feed network of 4 stages or more.

In an example, the first feed network 405A and the second feed network 405B correspond to Wilkinson networks that are built from a parallel combination of many quarter-wave segments that correspond to the 100Ω filaments. This configuration facilitates driving the resonators 205 of the LC tiles from multiple points that are uniformly spaced across the integrated circuit. This multistage configuration has minimal area overhead relative to the size of the LC tile 105. In an example, the total overhead for such a feed network 405 is about 1% of the resources compared to the combination of local resonators. In some examples, the quarter-wave segments are implemented as transmission lines, lumped LCs, or lumped-element transmission lines. As described below, in some examples, the coupling network is formed within the same stack of layers as the local LC tiles. This aspect improves the tolerance of process variations.

Figure 5B:
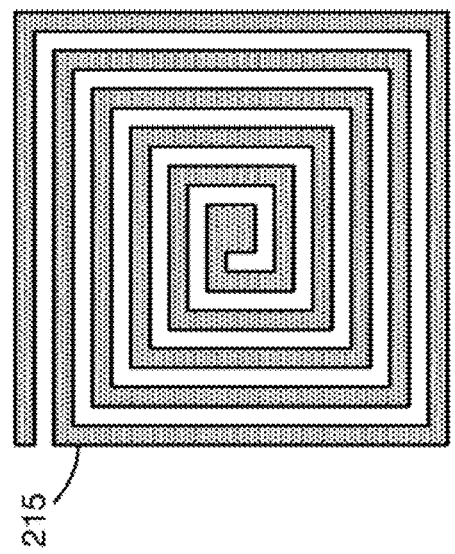
FIG. 5B illustrates a spiral inductor implemented in the fabrication stack, in accordance with example embodiments.
Figure 5A:
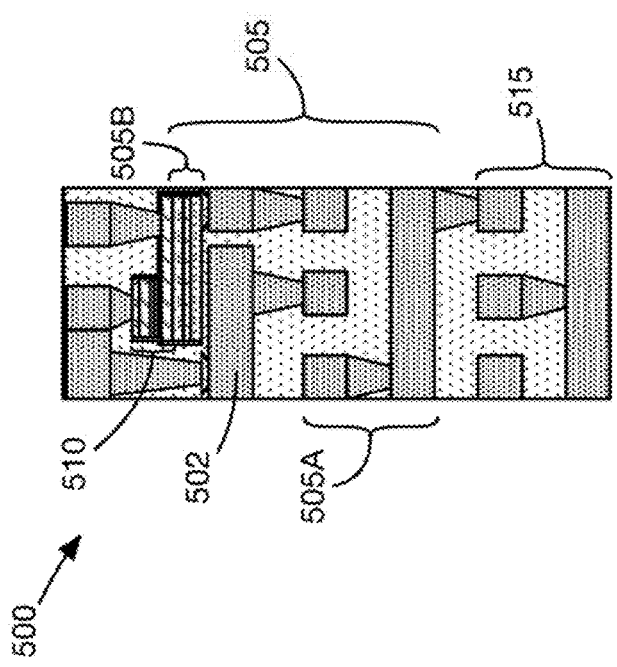
FIG. 5A illustrates a partial cross-section of a fabrication stack of superconducting circuits in which some examples of the LC tiles described above are fabricated, in accordance with example embodiments.

FIG. 5A illustrates an example of a partial cross-section of a fabrication stack 500 of superconducting circuits in which some examples of the LC tiles 105 described above are fabricated. The fabrication stack 500 includes first/resonator layers 505 in which one or more resonators such as any of the resonators described above are formed. Some examples of the resonator layers 505 comprise one or more inductor layers 505A and one or more capacitor layers 505B in which inductors and capacitors such as those described above are formed. FIG. 3B illustrates a top view of an example of an inductor 215 formed within the stacked superconducting circuits. Some examples of the fabrication stack 500 include a ground plane 502 below the one or more capacitor layers 505B to provide isolation.

Some examples of the fabrication stack 500 also include second/Josephson junction layers 510 in which one or more Josephson junctions such as any of the Josephson junctions described above are formed. Some examples of the fabrication stack 500 further comprise third/conductive interconnect layers 515 in which one or more interconnect such as any of the resonator-to-resonator interconnects described above are formed.

In some examples, the area of a particular tile 105 is set either by the capacitors or inductor and is made to match the area of corresponding Josephson junctions. For example, 100 Josephson junctions 110 having an average critical current, $I_c$, of 50 µA at a critical current density of $$J_C = 100 \ \frac{kA}{cm^2}$$

occupy a 5×5 µm² area, which accommodates 100 capacitors, but may only accommodate one inductor.

Some examples of the capacitors are implemented as Metal-Insulator-Metal (MIM) structures that comprise a high-K dielectric and high kinetic inductance electrodes (e.g., NbTiN electrodes). The MIM capacitors are sized to provide bias current, $I_b$, to the junction given by $$\frac{I_b}{I_c} \approx 0.75.$$

The target capacitance for the 35 µA junction is 2.6 fF and scales linearly with junction size.

In some examples of the MIM capacitors, the dielectric comprises $HfO_x(Si)$, which has a high dielectric constant, k, and which facilitates tuning of the capacitance via an applied DC voltage. In an example, the area, A, of the smallest capacitor is A=0.1 µm² which corresponds to a capacitor having a dielectric constant, k, of 32 and a 10 nm thickness. In some examples, the MIM capacitors have NbTiN electrodes.

As shown in FIG. 5B, some examples of the inductor 215 are implemented as a spiral and comprise high kinetic inductance wires such as NbTiN wires. With a typical inductance of 2 pH/µm for a 200 nm NbTiN wire, the spiral inductor fits within the 5×5 µm² area.

In some examples, the maximum number of the Josephson junctions in a particular LC tile 105 is set by total bias current through the inductor 215, which must not exceed the critical current of the high kinetic inductance wire. The critical current of the wire is a function of the cross-section of the wire. A wire that comprises NbTiN and that has a cross-section 200 nm width×200 nm thickness can carry up to 5 mA of current. This sets the number of Josephson junctions per tile to about 100, with an average critical current of 50 µA.

FIG. 6 illustrates examples of operations 600 that facilitate fabricating a superconducting circuit. The operations at block 605 involve forming, in first layers 505 of a fabrication stack 500, a resonator 205. The resonator 205 comprises an inductor 215 comprising a first terminal and a second terminal and a capacitor 220 comprising a first terminal electrically coupled to the second terminal of the inductor 215.

The operations at block 610 involve forming, in second layers 510 of the fabrication stack 500, a Josephson junction 210. The Josephson junction 210 comprises a first terminal electrically coupled to a second terminal of the capacitor 220 and a second terminal electrically coupled to the common node. The terminal shared by the inductor 215 and the capacitor 220 is configured to be electrically coupled to an alternating current (AC) voltage source 225 having a particular frequency and particular phase. The inductance of the inductor 215 and the capacitance of the capacitor 220 are selected to cause the resonator 205 to resonate at a frequency and a phase that substantially match the particular frequency and the particular phase, respectively, of the AC voltage source 225 to facilitate switching a state of the Josephson junction 210 via a single flux quantum (SFQ) pulse.

In some examples of the operations, forming the resonator 205 that comprises a capacitor 220 electrically coupled to the second terminal of the inductor 215 involves forming a plurality of capacitors 220 electrically coupled to the second terminal of the inductor 215, and forming the Josephson junction 210 that comprises a first terminal electrically coupled to a second terminal of the capacitor 220 comprises forming a plurality of Josephson junctions 210. In these examples, each Josephson junction 210 is electrically coupled to one of the plurality of capacitors 220. And in these examples, the inductor 215 is configured so that the inductance of the inductor scales inversely with a number of the plurality of capacitors 220.

In some examples, forming the resonator 205 in the first layers 505 involves forming, in the first layers 505, a plurality of resonators 205. These examples further involve forming in third layers 515 of the fabrication stack 500, a conductive interconnect configured to couple resonant energy between the plurality of resonators 250 to facilitate equalizing respective phases and amplitudes of the plurality of resonators 250 with one another.

Some examples involve electrically coupling a first subset of the plurality of resonators 250 to a first AC voltage source 225 having a first phase, and electrically coupling a second subset of the plurality of resonators 250 to a second AC voltage source 225 having a second phase that is different from the first phase. In these examples, forming the conductive interconnect in the third layers 515 of the fabrication stack 500 involves forming a first conductive interconnect configured to couple resonant energy between the first subset of the plurality of resonators 250 to facilitate equalizing respective phases and amplitudes of the first subset of the plurality of resonators 250 with one another, and forming a second conductive interconnect configured to couple resonant energy between the second subset of the plurality of resonators 250 to facilitate equalizing respective phases and amplitudes of the second subset of the plurality of resonators 250 with one another.

Some examples of the operations involve forming, in fourth layers of the fabrication stack, a splitter (e.g., two-stage network 405) comprising a first terminal configured to be coupled to the AC voltage source 225 and a plurality of outputs configured to be electrically coupled to respective first terminals of the capacitors 220 of the plurality of resonators 250.

In some examples, forming the splitter in the fourth layers comprises forming a Wilkinson network in the fourth layers.

Some examples involve electrically coupling the first terminal of the capacitor 220 to a direct current (DC) voltage source 260 to facilitate adjusting a capacitance of the capacitor 220 and a resonant frequency of the resonator 250.

Some examples involve forming, in the first layers 505 of the fabrication stack, a second resonator 260B. In these examples, the second resonator 260B comprises an inductor 215 comprising a first terminal electrically coupled the first terminal of the inductor 215 of the first resonator 260A. The respective first terminals of the inductors 215 correspond to a virtual ground node. The second resonator 260B also comprises a capacitor 220 comprising a first terminal electrically coupled to a second terminal of the inductor 215 and a second terminal configured to be electrically coupled to a Josephson junction 210. In these examples the second resonator 260B is electrically coupled to the AC voltage source 225 via the virtual ground node, thereby configuring the second resonator 260B to be 180° out-of-phase with the first resonator 260A.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A superconducting circuit comprising:
    a resonator, wherein the resonator comprises:
        an inductor comprising a first terminal and a second terminal; and
        a capacitor comprising a first terminal electrically coupled to the second terminal of the inductor; and
    a Josephson junction comprising a first terminal electrically coupled to a second terminal of the capacitor and a second terminal electrically coupled to the common node, wherein the terminal shared by the inductor and the capacitor is configured to be electrically coupled to an alternating current (AC) voltage source having a particular frequency and particular phase,
    wherein an inductance of the inductor and a capacitance of the capacitor are selected to cause the resonator to resonate at a frequency and a phase that substantially match the particular frequency and the particular phase, respectively, of the AC voltage source to facilitate switching a state of the Josephson junction via a single flux quantum (SFQ) pulse.

2. The superconducting circuit according to claim 1, wherein the capacitor is one of a plurality of capacitors electrically coupled to the second terminal of the inductor and the Josephson junction is one of a plurality of Josephson junctions, wherein each Josephson junction is electrically coupled to one of the plurality of capacitors, wherein the inductor is configured so that the inductance of the inductor scales inversely with a number of the plurality of capacitors.

3. The superconducting circuit according to claim 1, wherein the resonator is one of a plurality of resonators, wherein the superconducting circuit further comprises:
    a conductive interconnect configured to couple resonant energy between the plurality of resonators to facilitate equalizing respective phases and amplitudes of the plurality of resonators with one another.

4. The superconducting circuit according to claim 3, wherein:

a first subset of the plurality of resonators is configured to be electrically coupled to a first AC voltage source having a first phase, and a second subset of the plurality of resonators is configured to be coupled to a second AC voltage source having a second phase that is different from the first phase, and the conductive interconnect comprises a first conductor configured to couple resonant energy between the first subset of the plurality of resonators to facilitate equalizing respective phases and amplitudes of the first subset of the plurality of resonators with one another, and a second conductor configured to couple resonant energy between the second subset of the plurality of resonators to facilitate equalizing respective phases and amplitudes of the second subset of the plurality of resonators with one another.

5. The superconducting circuit according to claim 3, further comprising:

a splitter comprising a first terminal configured to be coupled to the AC voltage source and a plurality of outputs configured to be electrically coupled to respective terminals shared by the inductor and the capacitor of each of the plurality of resonators.

6. The superconducting circuit according to claim 5, wherein the splitter corresponds to a Wilkinson network.

7. The superconducting circuit according to claim 1, wherein the terminal shared by the inductor and the capacitor is further configured to be electrically coupled to a direct current (DC) voltage source, wherein a resonant frequency of the resonator depends in part on a voltage of the DC voltage source.

8. The superconducting circuit according to claim 1, further comprising:

a second resonator, wherein the second resonator comprises:

an inductor comprising a first terminal electrically coupled to the first terminal of the inductor of the first resonator, wherein respective first terminals of the inductors correspond to a virtual ground node; and a capacitor comprising a first terminal electrically coupled to a second terminal of the inductor and a second terminal configured to be electrically coupled to a Josephson junction, wherein the second resonator is electrically coupled to the AC voltage source via the virtual ground node, thereby configuring the second resonator to be 180° out-of-phase with the first resonator.

9. The superconducting circuit according to claim 1, wherein the inductor, the capacitor, and the Josephson junction are vertically integrated on different layers of an integrated circuit.

10. The superconducting circuit according to claim 9, wherein the capacitor corresponds to a metal-insulator-metal (MIM) capacitor comprising high kinetic inductance electrodes and wherein the inductor is formed from high kinetic inductance wires.

11. The superconducting circuit according to claim 10, wherein the high kinetic inductance wires corresponds to NbTiN.

12. A method for fabricating a superconducting circuit, the method comprising:

forming, in first layers of a fabrication stack, a resonator, wherein the resonator comprises:

an inductor comprising a first terminal and a second terminal; and a capacitor comprising a first terminal electrically coupled to the second terminal of the inductor; and forming, in second layers of the fabrication stack, a Josephson junction, wherein the Josephson junction comprises a first terminal electrically coupled to a second terminal of the capacitor and a second terminal electrically coupled to the common node, wherein the terminal shared by the inductor and the capacitor is configured to be electrically coupled to an alternating current (AC) voltage source having a particular frequency and particular phase, wherein an inductance of the inductor and a capacitance of the capacitor are selected to cause the resonator to resonate at a frequency and a phase that substantially match the particular frequency and the particular phase, respectively, of the AC voltage source to facilitate switching a state of the Josephson junction via a single flux quantum (SFQ) pulse.

13. The method according to claim 12, wherein:

forming the resonator that comprises a capacitor electrically coupled to the second terminal of the inductor comprises forming a plurality of capacitors electrically coupled to the second terminal of the inductor; and forming the Josephson junction that comprises a first terminal electrically coupled to a second terminal of the capacitor comprises forming a plurality of Josephson junctions, wherein in each Josephson junction is electrically coupled to one of the plurality of capacitors, wherein the inductor is configured so that the inductance of the inductor scales inversely with a number of the plurality of capacitors.

14. The method according to claim 12, wherein forming the resonator in the first layers comprises forming, in the first layers, a plurality of resonators, wherein the method further comprises:

forming in third layers of the fabrication stack, a conductive interconnect configured to couple resonant energy between the plurality of resonators to facilitate equalizing respective phases and amplitudes of the plurality of resonators with one another.

15. The method according to claim 14, further comprising:

electrically coupling a first subset of the plurality of resonators to a first AC voltage source having a first phase; and electrically coupling a second subset of the plurality of resonators to a second AC voltage source having a second phase that is different from the first phase, wherein forming the conductive interconnect in the third layers of the fabrication stack comprises:

forming a first conductor configured to couple resonant energy between the first subset of the plurality of resonators to facilitate equalizing respective phases and amplitudes of the first subset of the plurality of resonators with one another; and forming a second conductor configured to couple resonant energy between the second subset of the plurality of resonators to facilitate equalizing respective phases and amplitudes of the second subset of the plurality of resonators with one another.

16. The method according to claim 14, further comprising:

forming, in fourth layers of the fabrication stack, a splitter comprising a first terminal configured to be coupled to the AC voltage source and a plurality of outputs configured to be electrically coupled to respective first terminals of each capacitor of the plurality of resonators.

17. The method according to claim 16, wherein forming the splitter in the fourth layers comprises:
forming a Wilkinson network in the fourth layers.

18. The method according to claim 12, further comprising electrically coupling the terminal shared by the inductor and the capacitor to a direct current (DC) voltage source to facilitate adjusting a capacitance of the capacitor and a resonant frequency of the resonator.

19. The method according to claim 12, further comprising:
forming, in the first layers of the fabrication stack, a second resonator, wherein the second resonator comprises:
an inductor comprising a first terminal electrically coupled to the first terminal of the inductor of the first resonator, wherein respective first terminals of the inductors correspond to a virtual ground node; and
a capacitor comprising a first terminal electrically coupled to a second terminal of the inductor and a second terminal configured to be electrically coupled to a Josephson junction,
wherein the second resonator is electrically coupled to the AC voltage source via the virtual ground node, thereby configuring the second resonator to be 180° out-of-phase with the first resonator.

20. A device comprising a superconducting circuit, wherein the superconducting circuit comprises:
a resonator that comprises:
an inductor comprising a first terminal and a second terminal; and
a capacitor comprising a first terminal electrically coupled to the second terminal of the inductor; and
a Josephson junction comprising a first terminal electrically coupled to a second terminal of the capacitor and a second terminal electrically coupled to the common node, wherein the terminal shared by the inductor and the capacitor is configured to be electrically coupled to an alternating current (AC) voltage source having a particular frequency and particular phase,
wherein an inductance of the inductor and a capacitance of the capacitor are selected to cause the resonator to resonate at a frequency and a phase that substantially match the particular frequency and the particular phase, respectively, of the AC voltage source to facilitate switching a state of the Josephson junction via a single flux quantum (SFQ) pulse.

* * * * *